United States Patent
Matsubara et al.

(10) Patent No.: US 10,971,329 B2
(45) Date of Patent: Apr. 6, 2021

(54) FIELD IONIZATION SOURCE, ION BEAM APPARATUS, AND BEAM IRRADIATION METHOD

(71) Applicant: HITACHI HIGH-TECH CORPORATION, Tokyo (JP)

(72) Inventors: Shinichi Matsubara, Tokyo (JP); Hiroyasu Shichi, Tokyo (JP); Tomihiro Hashizume, Tokyo (JP); Yoshimi Kawanami, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/074,601

(22) PCT Filed: Feb. 5, 2016

(86) PCT No.: PCT/JP2016/053507
§ 371 (c)(1),
(2) Date: Aug. 1, 2018

(87) PCT Pub. No.: WO2017/134817
PCT Pub. Date: Aug. 10, 2017

(65) Prior Publication Data
US 2019/0051491 A1    Feb. 14, 2019

(51) Int. Cl.
*H01J 37/285*    (2006.01)
*H01J 37/08*     (2006.01)
(Continued)

(52) U.S. Cl.
CPC .......... *H01J 37/285* (2013.01); *G02B 21/002* (2013.01); *H01J 27/024* (2013.01);
(Continued)

(58) Field of Classification Search
None
See application file for complete search history.

(56) References Cited

U.S. PATENT DOCUMENTS 8,847,173 B2 *   9/2014   Kawanami ............ H01J 1/3044
                                                250/423 F
2006/0006348 A1  1/2006   Yamazaki et al.
(Continued)

FOREIGN PATENT DOCUMENTS

JP    10-302707 A      11/1998
JP    10302707 A   *   11/1998
(Continued)

OTHER PUBLICATIONS

International Search Report dated Apr. 5, 2016, in International Application No. PCT/JP2016/053507.

*Primary Examiner* — Andrew Smyth
(74) *Attorney, Agent, or Firm* — Miles & Stockbridge, P.C.

(57) ABSTRACT

An $H_3^+$ ion is used as an ion beam to achieve improvement in focusing capability influencing observed resolution and machining width, improvement in the beam stability, and a reduction in damage to the sample surface during the beam irradiation, in the process of observation and machining of the sample surface by the ion beam. The $H_3^+$ ion can be obtained by use of a probe current within a voltage range 21 around a second peak 23 occurring when an extracted voltage is applied to a needle-shaped emitter tip with an apex terminated by three atoms or less, in an atmosphere of hydrogen gas.

22 Claims, 10 Drawing Sheets

(51) Int. Cl.
*G02B 21/00* (2006.01)
*H01J 27/02* (2006.01)
(52) U.S. Cl.
CPC ......... *H01J 37/08* (2013.01); *H01J 2237/057* (2013.01); *H01J 2237/061* (2013.01); *H01J 2237/0807* (2013.01)

(56) References Cited

U.S. PATENT DOCUMENTS

| | | | |
|---|---|---|---|
| 2008/0283916 A1* | 11/2008 | Yamazaki | H01L 21/02321 257/347 |
| 2009/0117680 A1* | 5/2009 | Yamazaki | H01L 31/1892 438/57 |
| 2009/0127555 A1* | 5/2009 | Yamazaki | H01L 31/03685 257/51 |
| 2012/0217391 A1* | 8/2012 | Shichi | H01J 37/08 250/306 |
| 2013/0119252 A1 | 5/2013 | Kawanami et al. | |
| 2013/0255577 A1* | 10/2013 | Chang | H01J 37/08 118/723 R |
| 2015/0041650 A1 | 2/2015 | Kawanami et al. | |
| 2015/0053866 A1* | 2/2015 | Aramaki | G21K 1/14 250/423 R |

FOREIGN PATENT DOCUMENTS

| | | | | |
|---|---|---|---|---|
| JP | 2007-073534 A | | 3/2007 | |
| JP | 2007073534 A | * | 3/2007 | |
| WO | 2012017789 A1 | | 2/2012 | |
| WO | WO-2012017789 A1 | * | 2/2012 | ............. H01J 37/08 |
| WO | 2013150861 A1 | | 10/2013 | |
| WO | WO-2013150861 A1 | * | 10/2013 | ............. H01J 37/26 |

* cited by examiner

FIELD IONIZATION SOURCE, ION BEAM APPARATUS, AND BEAM IRRADIATION METHOD

TECHNICAL FIELD

The present invention relates to a field ionization source, an ion beam apparatus and a beam irradiation method.

BACKGROUND ART

An electron beam is focused through an electromagnetic lens to irradiate and scan a sample, and then detecting the secondary electron charged particles released from the sample enables the observation of sample surface structure. This is called a scanning electron microscope. Likewise, an ion beam is focused through an electromagnetic lens to irradiate and scan a sample, and then detecting the secondary charged particles released from the sample can also enable the observation of sample surface structure. This is called a Scanning Ion Microscope (hereinafter abbreviated to "SIM").

And, one type of ion sources used in SIM is a Gas Field Ionization Source (hereinafter abbreviated to "GFIS"). GFIS has previously a metal emitter tip with an apex curvature radius of the order of 100 nm or less, and high voltage is applied to the emitter tip so that an electric filed is concentrated on the tip. Then, gas is introduced around the apex (an ionized gas) so that the gas molecules are ionized in the electric filed to be extracted as an ion beam.

In SIM using GFIS (hereinafter abbreviated to "GFIS-SIM"), an apparatus using a helium ion beam or neon beam is mainstream. This is because, as compared with liquid-metal ion sources and ion sources using plasma phenomenon, the ion beam released from GFIS has a narrower energy width and the size of the light source is small, so that the ion beam can be finely focused.

Patent Literature 1 discloses an example of the gas field ionization sources, in which an emitter electrode included in the gas field ionization source has at least a base made of single crystal metal and has a tip formed in a pyramid shape or a cone shape, and also an extraction voltage is configured to be 10 kV or more for the ionization of helium gas.

CITATION LIST

Patent Literature

Patent Literature 1: WO2012/017789

SUMMARY OF INVENTION

Technical Problem

However, helium gas, which is a current mainstream gas species, has a drawback. The ionized helium energy is the highest of all the atoms, and therefore a high electric field is required to be produced at the emitter tip apex to ionize ions at the apex. And, to ensure enough brightness for practical applications of GFIS, an ion beam must be emitted while the emitter tip apex is terminated by several atoms. However, an extremely high extraction voltage increased for the emission of an ion beam causes a loss of the atoms at the emitter tip apex due to a phenomenon called field evaporation, thereby making ion emission impossible. At this time, in order to reproduce the original brightness of GFIS, the time to reproduce the atom termination shape and/or the time to reproduce the optical conditions of the apparatus after the reproduction is required.

Also, a helium ion belongs to a smaller mass group of the ion species extracted by GFIS. Nevertheless, damage occurs on a sample in the observation applications of GFIS-SIM. In conventional requirement specifications, such a level of damage has been insignificant, but, recently, impacts on the damage have become tangible.

To address this, the use of a hydrogen GFIS that emits small-mass hydrogen ions is studied in order to decrease damage when observing a sample and also to lower the ionization energy. However, conventional hydrogen GFIS has also a drawback. Specifically, in the conventional hydrogen GFIS, theoretically, the energy width of the ion beam is larger than that in helium. Therefore, a disadvantageous increase in observed resolution or in a machining width arises.

In short, the conventional techniques fail to achieve a level of satisfaction with the focusing capability influencing observed resolution and a machining width, the beam stability, and a reduction in damage during beam irradiation, and ensuring compatibility among them is an issue.

It is an object of the present invention to provide a technique capable of improving the focusing capability influencing observed resolution and machining width, improving the beam stability, and reducing damage during beam irradiation, in the process of observation and machining of a sample surface by an ion beam.

Solution to Problem

As one embodiment to achieve the above-described objet, an ion beam apparatus includes: a gas field ionization source that emits an ion beam containing a $H_3^+$ ion; a beam irradiation column that includes a lens capable of focusing an ion emitted from the gas field ionization source, and a deflector capable of deflecting an ion beam; a sample stage on which a sample to be irradiated with an ion beam passing through the beam irradiation column is loaded; and a sample chamber that houses at least the sample stage, wherein an abundance ratio of the $H_3^+$ ion is the highest in ion species emitted from the emitter tip.

Further, as another aspect, an ion beam apparatus has: a gas field ionization source; a beam irradiation column that is equipped with a lens capable of focusing an ion emitted from the gas field ionization source, and a deflector capable of deflecting an ion beam; a sample stage on which a sample to be irradiated with an ion beam passing through the beam irradiation column is loaded; and a sample chamber that houses at least the sample stage. The ion beam apparatus has an operation status to cause ion emission around a second extraction voltage of first and second extraction voltages. The first extraction voltage gives a first maximum of an ion current extracted from the emitter tip, and the second extraction voltage gives a second maximum of the ion current and is higher than the first extraction voltage.

Further, as still another aspect, a gas field ionization source has: an emitter tip that has a needle-shaped apex; an extraction electrode that has an opening facing the emitter tip and located at a distance from the emitter tip; gas feed piping for feeding gas into an area around the emitter tip; a unit that applies and adjusts a voltage between the emitter tip and the extraction electrode to produce an electric field for ionization of the gas; and a unit that cools the emitter tip. The gas is a gas containing hydrogen. The gas field ionization source has an operating status in which an abundance ratio of a $H_3^+$ ion in a probe current is the highest in ion species emitted from the emitter tip.

Further, as yet another aspect, a gas field ionization source has: an emitter tip that has a needle-shaped apex; an extraction electrode that has an opening facing the emitter tip and located at a distance from the emitter tip; gas feed piping for feeding gas into an area around the emitter tip; a unit that applies a voltage between the emitter tip and the extraction electrode to produce an electric field for ionization of the gas; and a unit that cools the emitter tip. The gas is a gas containing hydrogen. The gas field ionization source has an operation status to cause ion emission around a second extraction voltage of first and second extraction voltages. The first extraction voltage gives a first maximum of an ion current extracted from the emitter tip, and the second extraction voltage gives a second maximum of the ion current and being higher than the first extraction voltage.

Further, as another aspect, a beam irradiation method includes: a steps of causing an emitter tip of a field ionization source to emit an ion beam; a step of irradiating a sample with an ion beam in which an abundance ratio of a $H_3^+$ ion is the highest in ion species emitted from the emitter tip; and observing or machining any of a shape, composition and potential of the sample by use of a reaction occurring by irradiating the sample with the ion beam.

Further, as another aspect, a beam irradiation method includes causing ion emission around a second extraction voltage of first and second extraction voltages. The first extraction voltage gives a first maximum of an ion current extracted from an emitter tip of a field ionization source, and the second extraction voltage gives a second maximum of the ion current and is higher than the first extraction voltage.

Advantageous Effects of Invention

Thus, according to the present invention, it is possible to provide a technique enabling improvement in focusing capability influencing observed resolution and machining width, improvement in beam stability, and a reduction in damage during beam irradiation, in the process of observation and machining of a sample surface by an ion beam.

DESCRIPTION OF EMBODIMENTS

Figure 1:
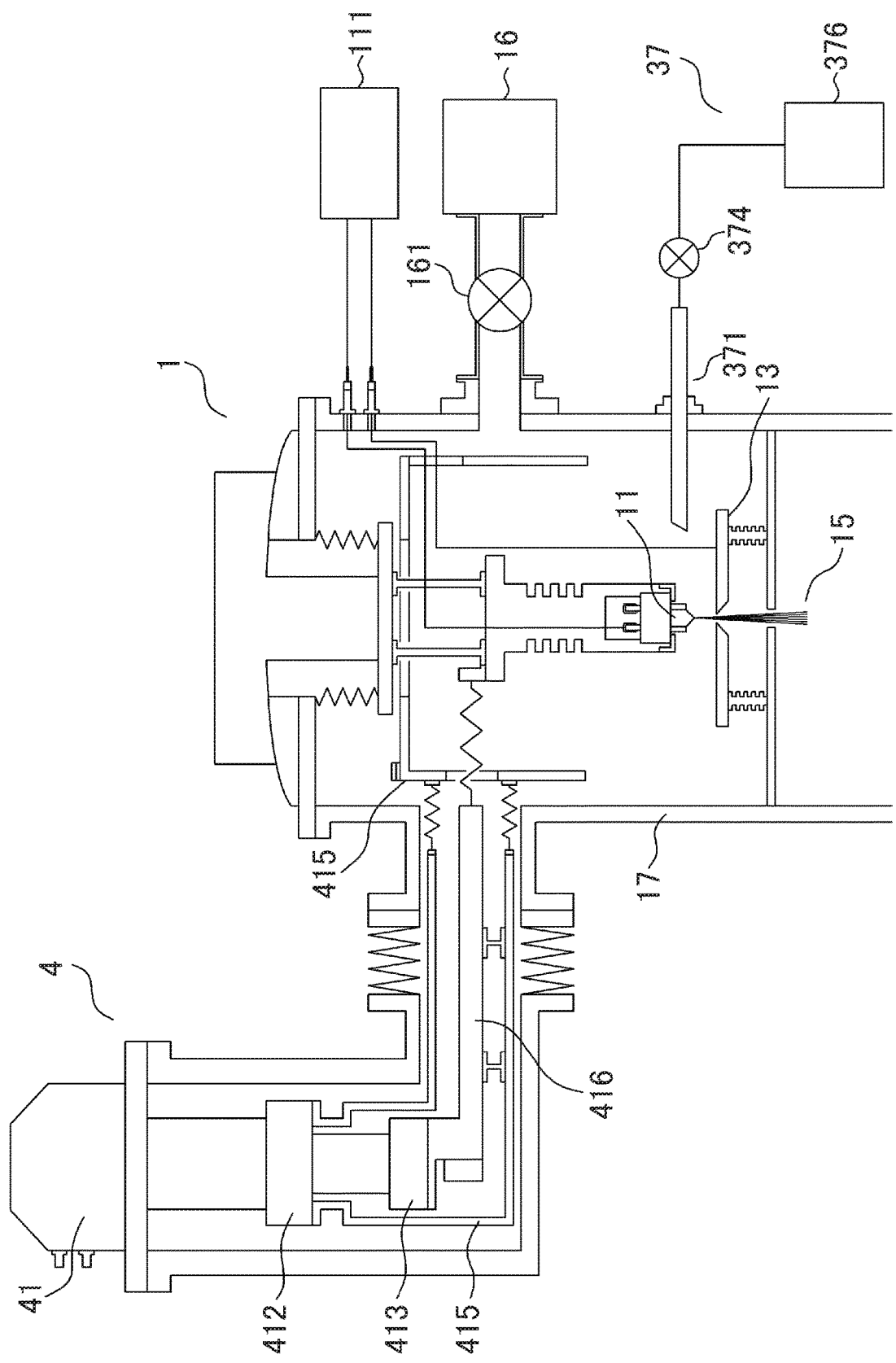
FIG. 1 is a schematic cross-sectional configuration view (partial block diagram) of a hydrogen gas field ionization source according to an embodiment of the present invention.

The inventors have studied to achieve practical use of an apparatus using a hydrogen ion beam. In this process, after the emitter tip apex was terminated by a single atom and then hydrogen gas was introduced, an ion current (probe current) was measured. Then, the inventors have found that, after a first peak (maximum), a second peak (maximum) appears within the range of extraction voltage before the atom at the emitter tip apex disappears due to a phenomenon called field evaporation. Such a phenomenon (phenomenon where a second peak is present after a first peak (maximum)) was not observed when the emitter tip apex was terminated by a single atom and helium gas was introduced.

Therefore, the phenomenon has been further analyzed. As a result, it has been found that (1) dominant constituents of the first peak are $H^+$ and $H_2^+$ and a dominant constituent of the second peak is $H_3^+$, and that (2) the energy width of $H_3^+$ which is dominant at the second peak is smaller than the energy width of $H^+$ and $H_2^+$ which are dominant at the second peak. This means that the $H_3^+$ beam can be made thinner than the $H^+$ and $H_2^+$, that is, high resolution can be provided.

In conventional methods, optical conditions are adjusted allowing for machining and observation using $H^+$ and $H_2^+$ which are at the first peak, and therefore setting of voltage after the first peak is not considered in most cases. Specifically, this is because of an increase in probability that another gas will adhere to the emitter tip to decrease the ion beam current and/or an increase in probability of field evaporation of the variable atom accumulating on the emitter tip apex. Accordingly, the present invention is a novel invention created based on findings made as a result of a detailed analysis of a phenomenon that has not been discovered in previously inconceivable use conditions.

The present invention will now be described in detail.

According to the present invention, for example, a hydrogen gas field ionization source is configured as described below to attain a solution of the above-described problems.

Specifically, a gas field ionization source has: an emitter tip with a needle-shaped apex; an extraction electrode that has an opening located opposite to and at a distance from the emitter tip; gas feed piping for feeding gas into an area around the emitter tip; a unit that applies and adjusts a voltage between the emitter tip and the extraction electrode to produce an electric field for ionization of the gas; and a unit that cools the emitter tip. In the gas field ionization source, the gas is a gas containing hydrogen, and an abundance ratio of the $H_3^+$ ion is the highest in ion species emitted from the emitter tip, thereby attaining a solution of the aforementioned problem.

The energy width of the $H_3^+$ ion is narrower than that of the $H_2^+$ ion extracted in the typical conditions as described above. With the hydrogen gas field ionization source applied to the ion beam apparatus, satisfactory observed resolution and a satisfactory machining width can be provided, and damage during sample observation can be reduced as compared with He ion irradiation, as well as the time required for reproduction of the apex shape of the emitter can be shortened as compared with He ion emission.

Further, regarding the $H_3^+$ ion, the energy of a hydrogen atom is ⅔ as compared with the $H_2^+$ ion in beam irradiation at the same acceleration energy, so that a further reduction in sample damage dependent on this amount, for example, mixing and/or the like, can be expected. Furthermore, because a $H_3^+$ ion beam has a narrow energy width, the $H_3^+$ ion can provide the same focusing capability at acceleration lower than the $H_2^+$ ion. This enables beam irradiation at low acceleration, resulting in minimized sample damage.

Further, the inventors have discovered a new ion emission method of maximizing the emission ratio of the $H_3^+$ ion in the hydrogen gas field ionization source. The phenomenon where the $H_3^+$ ion is emitted itself has been previously known, but the conditions where the emission ratio of the $H_3^+$ ion becomes the highest in hydrogen ion species have been previously unknown. These conditions are that the emitter tip is terminated by three or less atoms, most preferably, by a single atom, and the ion source is operated at the ion extraction voltage that is determined to an extraction voltage giving a second maximum of the probe current, in order to improve the emission ratio of the $H_3^+$ ion. That is, a higher degree of improving effect is produced when the number of atoms is two rather than three, and particularly, when the tip is terminated by a single atom, the maximum improving effect of the emission ratio is produced.

In other words, installing the gas field ionization source according to the present invention would improve the ion beam focusing ability and the stability of a charged particle beam apparatus. Also, the sample damage during observation by ion beam irradiation is reduced. Also, the number of times the shape of the emitter tip apex is reproduced is decreased to achieve improved usability of the apparatus.

Embodiments in accordance with the present invention will now be described using the accompanying drawings.

First Embodiment

A hydrogen gas field ionization source in accordance with embodiments of the present invention will be described with reference to FIGS. 1, 2, 3 and 4. It should be understood that the arrangement of the present application can be applied to anything other than contents described below without departing from the scope and sprit of the invention of the present application.

A hydrogen gas field ionization source 1 includes: an emitter electrode (emitter tip) 11 having a needle-shape apex; an extraction electrode 13 having an opening located opposite to the emitter electrode 11; a refrigerator 4 cooling the emitter electrode 11; a vacuum chamber 17 that houses all the emitter electrode 11 and the extraction electrode 13 as well as a first refrigerator stage 412 and a second refrigerator state 413 which are included in a refrigerator body 41 of the cooling mechanism 4; a vacuum evacuation unit 16 connected to the vacuum chamber 17; a gas feed unit (gas introducing mechanism) 37 feeding gas containing hydrogen gas into the vacuum chamber 17; and a high-voltage power supply 111 for applying voltage between the emitter electrode 11 and the extraction electrode 13 to generate an electric field for positive ionization of gas around the apex of the emitter electrode 11. The electrodes may be configured to be able to be controlled for voltage independently of each other, and the extraction voltage for generating the electric field may be configured to be able to be controlled independently of ion beam acceleration.

For emission of an ion beam 15 from the emitter tip 11 of the hydrogen gas field ionization source 1, initially, high voltage is applied between the emitter tip 11 and the extraction electrode 13. An electric field is focused at the apex of the emitter tip 11 by the application of high voltage. Assuming that the intensity of the electric filed generated at the apex is enough for positive ionization of hydrogen. In this state, the gas feed unit 37 is used to introduce hydrogen gas into the vacuum chamber 17, whereupon a hydrogen ion beam is emitted from the apex of the emitter tip 11. Incidentally, reference sign 161 indicates a flow-rate adjusting unit, reference sign 371 indicates a gas nozzle, reference sign 374 indicates a gas flow-rate adjusting unit, reference sign 376 indicates a gas cylinder, reference sign 415 indicates a thermal radiation shield and reference sign 416 indicates a heat exchanging unit.

Figure 2A:
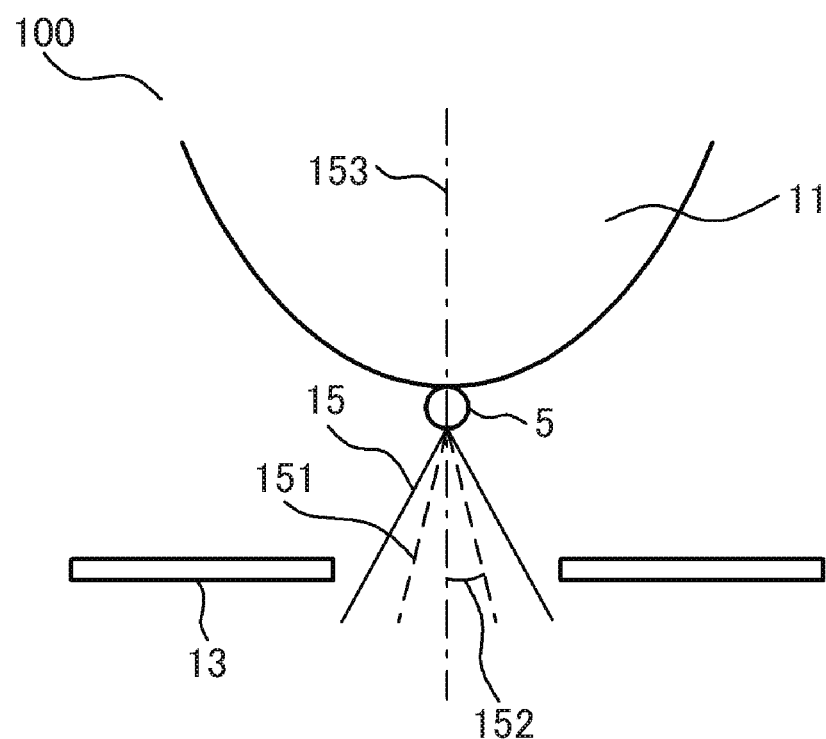
FIG. 2A is a schematic cross-sectional view of an emitter electrode apex of the hydrogen gas field ionization source in FIG. 1.
Figure 2B:
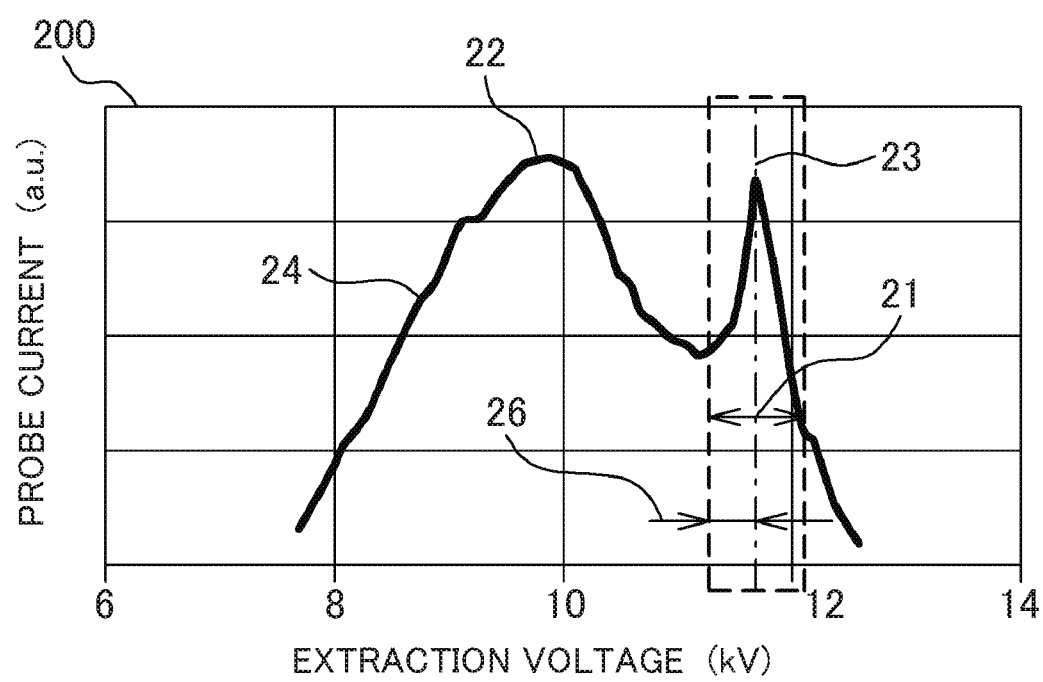
FIG. 2B is a graph showing example variations of probe current versus extraction voltage in the hydrogen gas field ionization source in FIG. 1.

Further, an apex shape 100 of the emitter electrode 11 illustrated in FIG. 2A is shown as an example where the apex 5 of the emitter electrode 11 is terminated by a single atom. Where the apex of the emitter electrode is terminated by three atoms or less as illustrated above, as in graph 200, the prove current value 24, which is obtained when the ion beam 15 extracted from the hydrogen gas field ionization source 1 is limited to a fixed radiation angle, changes relative to the value of an extraction voltage which is a difference from the voltage applied between the emitter electrode 11 and the extraction electrode 13 as illustrated in FIG. 2B. Incidentally, reference sign 151 indicates a probe current, reference sign 152 indicates a beam limit divergence angle, and reference sign 153 indicates an optical axis.

The value of the electric field produced at the emitter electrode apex by the extraction voltage applied between the emitter electrode 11 and the extraction electrode 13 varies according to the shape of the emitter electrode apex, notably a curvature radius and the like, even if the value of the extraction voltage is the same. Further, the phenomenon disclosed in the embodiment is caused by an electric field produced at the apex. Specifically, although, for the sake of convenience herein, the experimental results obtained when the effects of the embodiment have been verified, that is, graphs 200 and 201 illustrated in FIG. 2B and FIG. 2D, are used in the description, any absolute value of the extraction voltage shown herein imposes no limitation on the scope of the invention without departing from the spirit of the invention.

In the example graph 200 illustrated in FIG. 2B, the probe current value 24 has a first maximum 22 at an extraction voltage of about 10 kV, and also a second maximum 23 at an extraction voltage of about 11.68 kV which is higher than the extraction voltage giving the maximum (peak) 22. The inventors have discovered that, around the extraction voltage giving a second maximum, the emission ratio of the $H_3^+$ ion is higher than that of other hydrogen $H^+$ ion and $H_3^+$ ion. Term "around" described above means a voltage range 21 of, preferably, 5% above and below the absolute value of the extraction voltage giving a second maximum 23. In the example graph 200, it is meant to set an extraction voltage preferably ranging from 11.1 kV to 12.26 kV with respect to the extraction voltage of 11.68 kV giving a second maximum.

Figure 2C:
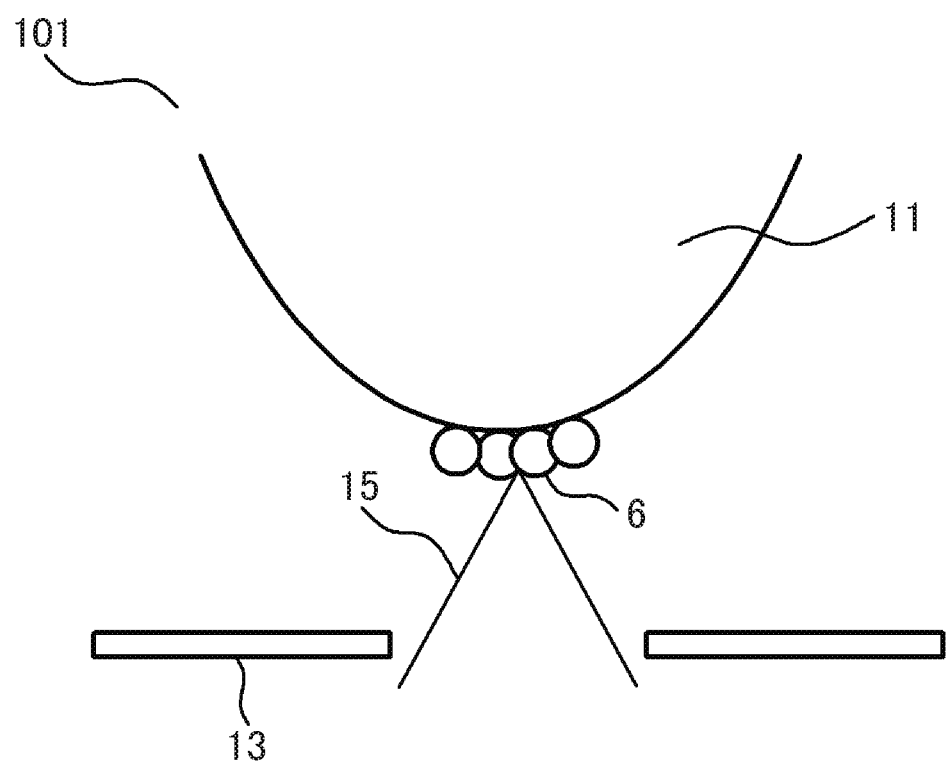
FIG. 2C is a schematic cross-sectional view of an emitter electrode apex of a hydrogen gas field ionization source (when apex atoms are four) studied by the inventors.
Figure 2D:
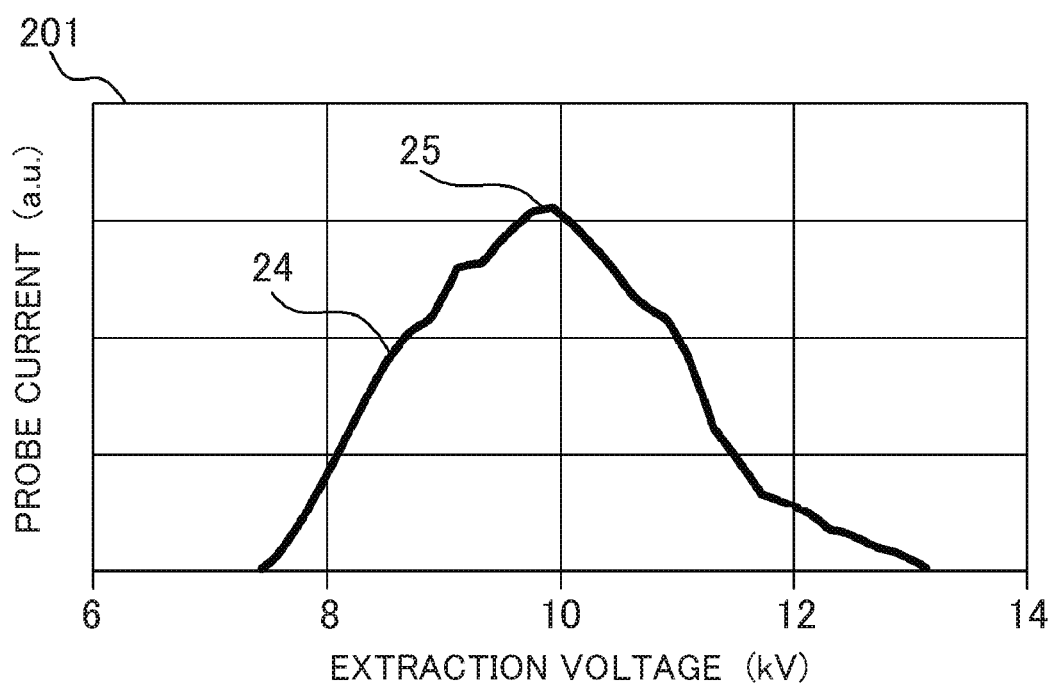
FIG. 2D is a graph showing example variations of probe current versus extraction voltage in the hydrogen gas field ionization source (when apex atoms are four or more) studied by the inventors.

On the other hand, FIG. 2C illustrates an example where an apex 6 of the emitter electrode 11 is terminated by four atoms or more. In this case, the probe current value 24, which is obtained when the ion beam 15 extracted from the hydrogen gas field ionization source is limited to a fixed radiation angle, changes relative to the value of an extraction voltage which is applied between the emitter electrode and the extraction electrode 13, as in example graph 201 illustrated in FIG. 2D. That is, the probe current value 24 has the only one maximum (peak) 25 at the extraction voltage of about 10 kV. At this time, unlike the example graph 200 illustrated in FIG. 2B, the $H_3^+$ ion emission is not observed over all extraction voltages on the graph, so that there is no ratio exceeding other hydrogen $H^+$ and $H_2^+$ ions. Further, the $H_2^+$ emission ratio is higher on the low voltage side of the maximum 25, and the $H^+$ emission ratio is increasing on the high voltage side. It is noted that the higher the emission ratio of the $H_3^+$ ion beam around the second maximum of the probe current, the lower number of atoms at the apex 6. Specifically, the emission ratio when the number of atoms is two is higher than that when it is three, and the state of the apex with one atom is most favorable for improving the emission ratio of the $H_3^+$ ion beam.

Figure 3A:
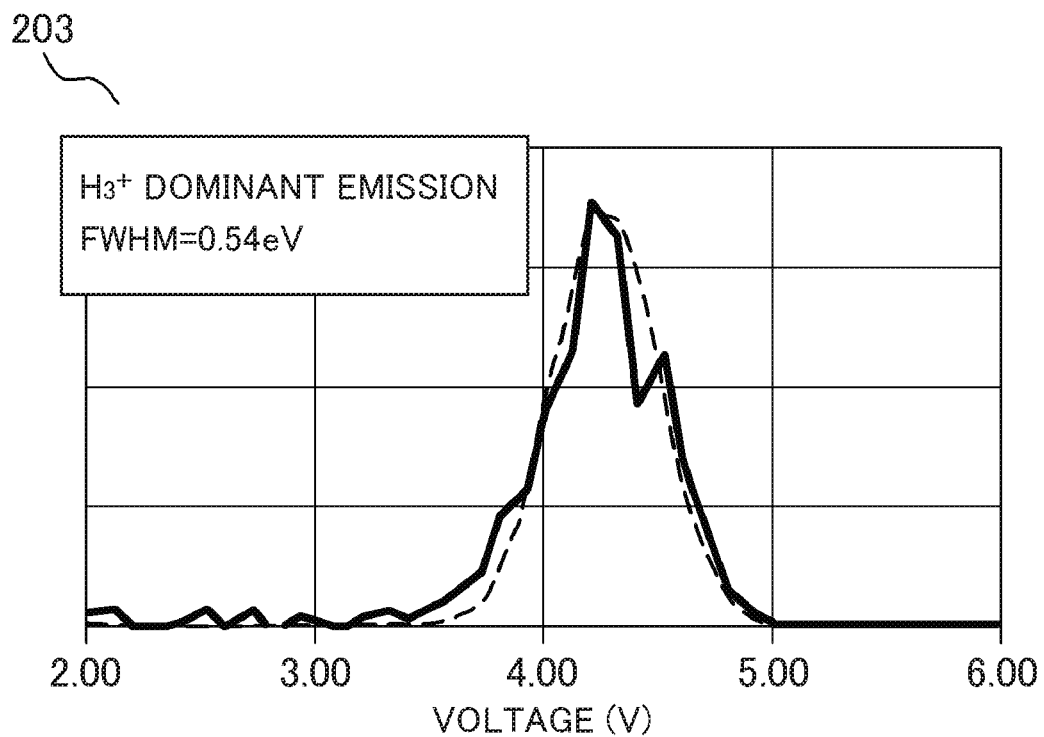
FIG. 3A is a graph showing example measurement of an energy width of a $H_3^+$ ion beam.
Figure 3B:
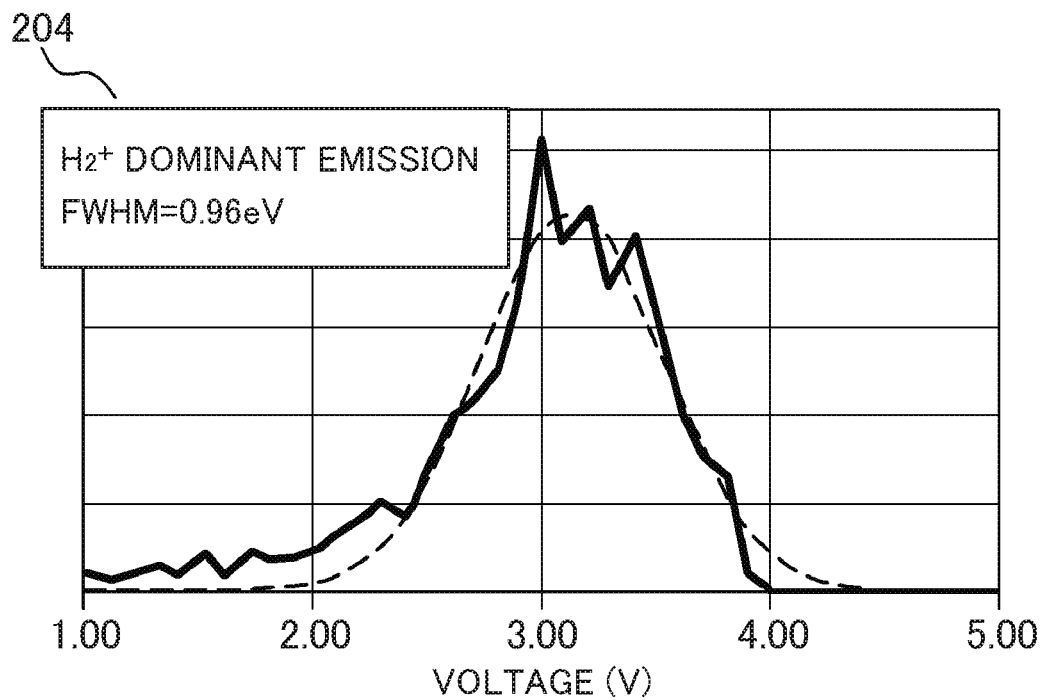
FIG. 3B is a graph showing example measurement of an energy width of a $H_2^+$ ion beam.

Further, shown in graph 203 illustrated in FIG. 3A is an example of energy width of an ion beam measured around the extraction voltage corresponding to the maximum 23 at which the $H_3^+$ ion emission ratio is higher than that of other hydrogen $H^+$, $H_2^+$ ions. Similarly, shown in graph 204 illustrated in FIG. 3B is an example of energy width of an ion beam measured at an extraction voltage lower than the extraction voltage corresponding to the maximum 25 at which the $H_2^+$ ion emission ratio is highest. The inventors has discovered that, as in the example illustrated in FIG. 3A, the $H_3^+$ ion beam has a narrower energy width than that of any beam of other hydrogen ions ($H^+$ ion and $H_2^+$ ion). In other words, with the ion beam apparatus equipped with the gas field ionization source emitting the $H_3^+$ ion beam, as compared with an ion beam apparatus including a gas field ionization ion source emitting a helium ion beam, sample damage caused by the ion beam irradiation during observation can be reduced without degradation in observed resolution by the ion beam and an increase in machining width. At this time, if the ratio of the $H_3^+$ ion to the ion beam directed to the sample is highest, the influence of other hydrogen ion ($H^+$ ion and $H_2^+$ ion) beam is mitigated, resulting in more suitability for observation and machining.

The inventors have discovered that the energy width of the ion beam changes even in the above-described region with a $H_3^+$ ion emission ratio being high. Specifically, it has been discovered that the ion beam extracted at an extraction voltage value within a 5% range below the extraction voltage corresponding to the second maximum 23 has a narrower energy width than that of the ion beam extracted at an extraction voltage value within a 5% range above the extraction voltage corresponding to the second maximum 23. Thus, in order to reduce the sample damage caused by the ion beam irradiation during observation without degradation in observed resolution and an increase in machining width as compare with the helium ion beam, an extraction voltage may be set within a range 26 (FIG. 2B) of, preferably, 5% below the absolute value of the extraction voltage corresponding to the second maximum 23. In the example graph 200 illustrated in FIG. 2B, it is meant to set an extraction voltage preferably ranging from 11.1 kV to 11.68 kV with respect to the extraction voltage of 11.68 kV giving the second maximum.

For improvement in the $H_3^+$ ion emission ratio, the metal of the emitter electrode 11 may be metal having a body-centered cubic lattice structure or a hexagonal close-packed structure. For example, metal such as tungsten, tantalum, molybdenum, niobium, rubidium, ruthenium, titanium, beryllium and the like may be used. Alternatively, highly-chemically-resistant metal, such as, e.g., iridium, tantalum and the like, may be used for the emitter electrode. The use of highly-chemically-resistant metal retards an erosive action of ionized gas or impurity gas contained in the ionized gas on the emitter electrode, leading to an expectation of the effect of stably operating the ion source. The inventors have verified the above-described phenomenon by use of the emitter electrode with the <111> oriented tungsten along a long axis direction.

Where gas is not introduced by the gas introducing mechanism 37, the inside of the vacuum chamber 17 of the hydrogen gas field ionization source 1 is maintained under ultrahigh vacuum at 10 Pa to 7 Pa or lower. In order for the ultrahigh vacuum to be reached in the vacuum chamber 17, heating the entire vacuum chamber 17 to 100 degrees or higher, i.e., baking, may be included in the startup process of the hydrogen gas field ionization source 1.

The fact that the apex 5 is terminated by a single atom means that an atom emitting an ion beam to be directed to a sample or the like is present on the metal crystal plane of the emitter electrode, and another atom adjacent to the atom is not present on the metal crystal plane. In conceivable circumstances in GFIS, a plurality of atoms emitting ion beams are present on the surface of the emitter electrode and the ion beams are emitted at different angles from the respective atoms. There is an example where helium ion beams are emitted from three atoms adjacent to each other on the crystal surface of, e.g., the <111> oriented tungsten. It is intended in the scope of the embodiment that the atoms emitting ion beams of the similar amounts of current are not adjacent to each other. For example, an ion beam emission from a protrusion created on the emitter electrode surface by adsorption of gas molecules to a position apart from an atom emitting an ion beam to be directed to a sample or the like, or alternatively, an ion beam emission from a side face of the crystal plane on the next lower layer than the layer on which the atom in question is held, is conceivable, an such a case is also included in the scope of the present invention. Further, on the next lower layer of the crystal plane, an atom combined with, adjacent to the atom in question does not include adjacent atoms on the plane.

Figure 4A:
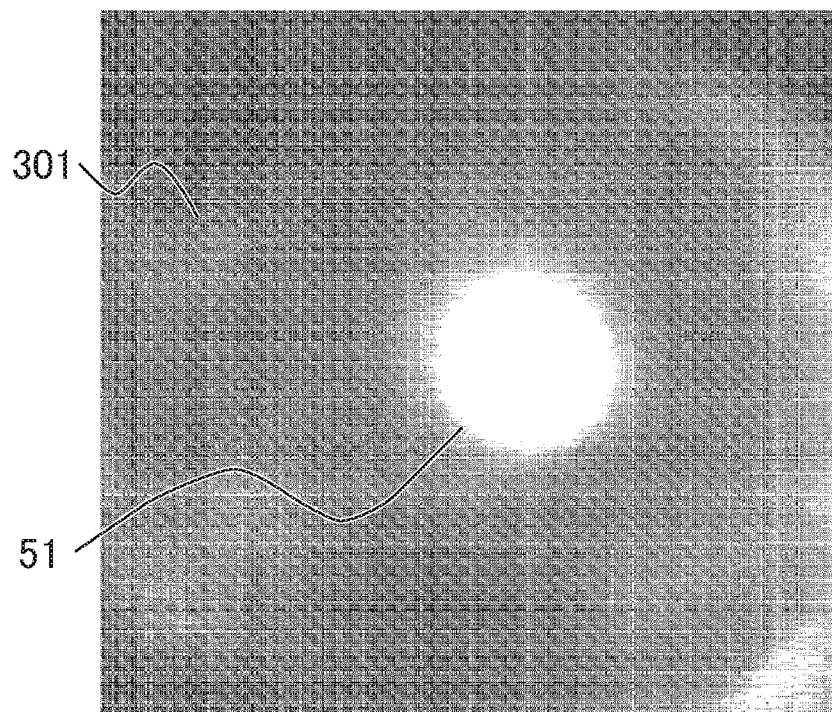
FIG. 4A is example measurement of a FIN image of the emitter electrode apex.
Figure 4B:
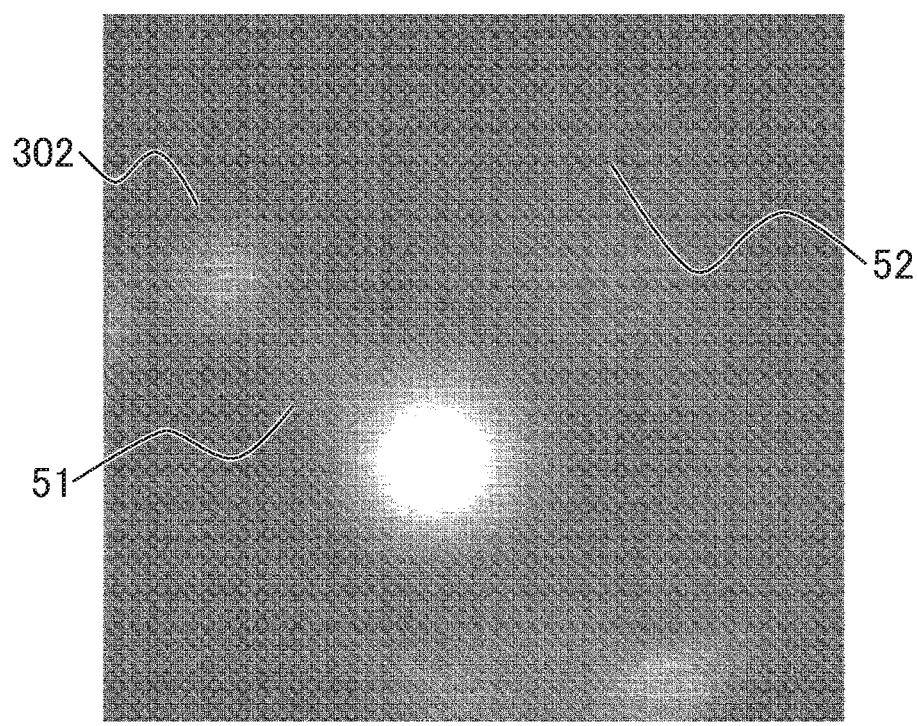
FIG. 4B is example measurement of a FIN image of the emitter electrode apex.

FIG. 4A to FIG. 4D show atom images of an apex shape of the emitter electrode 11 obtained by a technique of Field Ion Microscopy (hereinafter abbreviated to "FIN"). FIM images 301, 302 respectively shown in FIG. 4A and FIG. 4B are examples where the apex 5 is terminated by a single atom, which correspond to the apex shape 100 of the emitter electrode 11 shown in FIG. 2A. It has been actually verified that there are the voltage conditions as described above in which the $H_3^+$ ion emits in a high ratio with the apex shape of the above emitter electrode 11. That is, it has been verified that the probe current changes relative to the extraction voltage as in the example graph 200 shown in FIG. 2B. At this time, an atom 52 emits a sufficient lower amount of ion current than the ion current emitted from a single atom 51 at the apex, and even if the atom 52 is present in a location apart from the atom 51, the $H_3^+$ ion is able to be emitted in a high ratio from the atom 51.

Figure 4C:
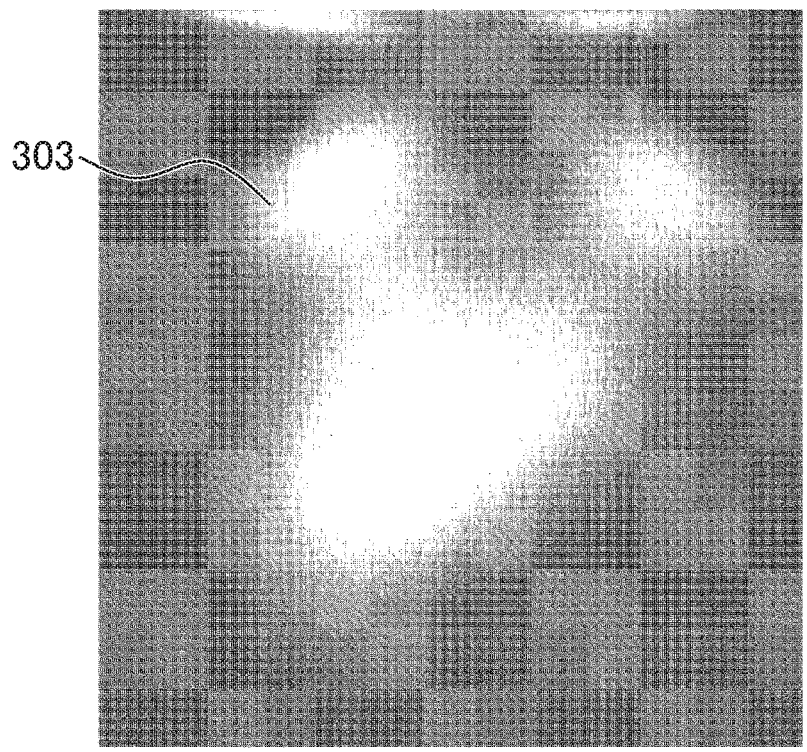
FIG. 4C is example measurement of a FIN image of the emitter electrode apex.
Figure 4D:
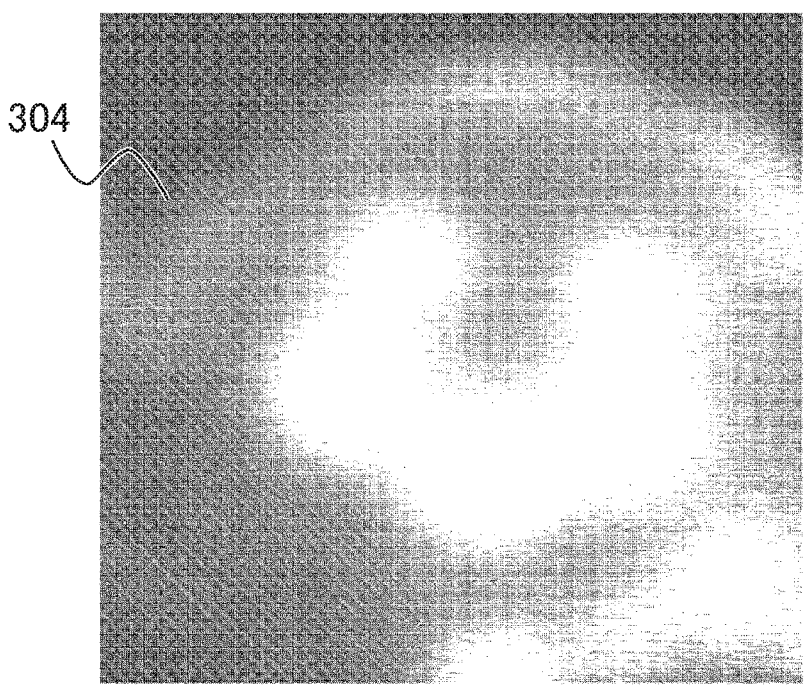
FIG. 4D is example measurement of a FIN image of the emitter electrode apex.

FIM images 303, 304 respectively shown in FIG. 4C and FIG. 4D are examples where the apex 6 of the emitter electrode 11 is terminated by four atoms or more, which correspond to the apex shape 101 of the emitter electrode 11 shown in FIG. 2C. It has been actually verified that there are no voltage condition in which the $H_3^+$ ion emits in a high ratio with the apex shape of the above emitter electrode 11. That is, it has been verified that the probe current value 24 changes relative to the extraction voltage as in the example graph 201 shown in FIG. 2D.

For the purpose of improving the $H_3^+$ ion emission ratio, the ion current extracted from the apex 5 of the emitter electrode 11 may be limited at a fixed beam limit divergence angle 152 with respect to the optical axis 153 (FIG. 2A). The probe current 151 limited at the beam limit divergence angle 152 may promise to improve the $H_3^+$ ion emission ratio as compared with the case of no limit being imposed. The magnitude of the probe current 151 corresponds to the probe current value 24. Preferably, the beam limit divergence angle 152 may be 5 mrad or less. For example, where the extraction voltage is set to produce an electric field allowing for an ion beam emission from the atom 51 in a high $H_3^+$ ion emission ratio, an electric field in a location of another atom such as the atom 52 which is present in a different location on the same tip is different from the electric field of the atom 51, so that an ion beam emission from the atom 52 may possibly be an emission in a low $H_3^+$ ion emission ratio. The inventors has verified that the beam limit to be 5 mrad or less enables a reduction in mixing of $H^+$ ion and $H_2^+$ ion from another atom such as the atom 52. Further, when consideration is given to the ion beam emission from only the atom 51, where the emission angle of the $H^+$ ion and $H_2^+$ ion is larger than the emission angle of the $H_3^+$ ion, decreasing the beam limit divergence angle can reduce the mixing of the $H^+$ ion and the $H_2^+$ ion. Also, when the beam limit divergence angle 152 is sufficiently large, the probe current 151 matches the ion beam 15.

In order to increase the brightness of the $H_3^+$ ion beam, the cooling temperature of the cooling mechanism 4 to cool the emitter tip 11 is preferably adjusted. In a state of this example of obtaining the probe current, the emitter electrode is cooled to approximately 40 K. The cooling mechanism 4 cools the interior of the hydrogen field ionization source 1, the emitter electrode 11, the extraction electrode 13 and the like. The cooling mechanism 4 may use, for example, a mechanical refrigerator such as of a Gifford-McMahon (GM) type, a pulse tube type, or the like, or alternatively, a cooling medium such as liquid helium, liquid nitrogen, solid nitrogen or the like. FIG. 1 illustrates an example configuration in the case of using a mechanical refrigerator. The mechanical refrigerator includes a refrigerator 41 having a first refrigerator stage 412 and a second refrigerator stage 413. A temperature from the second refrigerator stage 413 is thermally transferred to the emitter electrode 11, the extraction electrode 13 and the like by the heat exchanger unit 416 to cool them.

The first stage 412 with a lower cooling temperature than the second stage may be configured to cool the thermal radiation shield 415. The thermal radiation shield 415 is configured to cover the second refrigerator stage and, more preferably, the emitter electrode 11 and the extraction electrode 13. The radiation shield 415 can be causes a reduction in influence of thermal radiation from the vacuum chamber 17, thereby enabling cooling the second refrigerator stage 413, the emitter electrode 11, the extraction electrode 13 and the like with efficiency.

The heat exchange unit 416 may configured to include highly thermally conductive metal such as copper, silver, gold and/or the like. In order to mitigate the thermal radiation influence, the surface treatment, for example, gold plating and/or the like, may be applied to provide the surface with a metallic luster. If vibration created by the cooling mechanism 4 propagates to the emitter electrode 11, then, as a consequence of this, a decrease in resolution of the sample observation image by the ion beam, and/or the like is caused. Therefore, the heat exchanging unit 416 may be partially configured using a flexible component resistant to propagation of vibration, such as metallic stranded wire and/or the like. For similar reasons, the heat exchanging unit 416 may be configured to use the cooling unit 4 to cool gas or liquid and circulate the cooled gas or liquid for thermal transfer to the emitter electrode 11 and the extraction electrode 13. In such a configuration, the cooling unit 4 can be installed in a position at a distance from the apparatus body.

A temperature adjusting unit may be provided in the first stage 412, the second stage 413 or the heat exchanging unit 416. The temperature adjusting unit is used to adjust the temperature of the emitter electrode to increase the brightness of the $H_3^+$ ion beam, thereby improving the signal-to-noise ratio during sample observation and the throughput in sample machining.

For the purpose of increasing the brightness of the $H_3^+$ ion beam, the pressure of the hydrogen gas introduced into the vacuum chamber 17 may be suitably set. The total amount of ion current emitted from the emitter electrode can be understandably adjusted in accordance with a gas pressure value, and also the $H_3^+$ ion emission ratio can be adjusted to a certain extent by adjusting the gas pressure. The gas feed unit 37 includes the gas nozzle 371, the gas flow-rate adjusting unit 374, and the gas cylinder 376. The hydrogen gas is adjusted in a flow rate and introduced by and through the gas flow-rate adjusting unit 374 from the gas cylinder 376. The pressure in the vacuum chamber 17 is determined by a balance between the amount of gas evacuated by the vacuum evacuation unit 16 and the flow rate of the hydrogen gas introduced. The flow-rate adjusting unit 161 may be placed between the vacuum evacuation unit 16 and the vacuum chamber 17 to adjust the amount of gas evacuated. Hydrogen gas of sufficiently high purity produces the effect of stable operation of the ion source. Therefore, a filter may be used to increase the purity of the hydrogen gas as needed.

A gas mixture including hydrogen gas may be configured to be introduced, as gas fed from the gas nozzle 371, into an area around the emitter tip. For example, a gas mixture of neon gas and hydrogen gas may be introduced from the gas nozzle 371. In the above example, because largely different extraction voltages are required to emit neon ion and hydrogen ion from the emitter electrode, switching between the hydrogen ion emission and the neon ion emission may be made only by switching between the voltages. Unlike the hydrogen ion, the neon ion has large mass, and therefore this is suitable for the use for micromachining a sample because of the sputtering effect on the sample surface. It should be understood that switching between ions can be made by switching between single gases rather than the exemplified gas mixture.

Further, the gas stored in the gas cylinder 376 may be a gas mixture of hydrogen gas and other gas. Gas mixture storage for the purpose of the above-described ion switching is a matter of course, and the safety is improved by the configuration in which a gas mixture with a partial pressure equal to or less than the explosion limit of hydrogen gas is stored in the gas cylinder 376 and the above-described filter is used to feed hydrogen gas in a selective manner.

It is preferable that the emitter electrode 11 is cooled by the cooling mechanism 4. Cooling the emitter electrode 11 to, for example, the order of 40 K, is preferable in terms of an increase in the amount of hydrogen ion current and the stability of ion emission. Further, the $H_3^+$ ion emission ratio can be adjusted to a certain extent by adjusting the cooling temperature.

The hydrogen gas is introduced at high gas pressure into the overall interior of the vacuum chamber 17 from the above-described gas feed unit, whereupon heat is exchanged through the hydrogen gas introduced between the emitter electrode and the vacuum chamber 17. This gives rise to disadvantages such as inadequately cooling of the emitter electrode 11, condensation occurring in the vacuum chamber 17, and/or the like. Further, a high gas pressure state on the overall optical path of ion beam 15 emitted from the emitter electrode 11 gives rise to disadvantages such as a scattering of a part of the ion beam leading to less beam focusing ability, and/or the like. For this reason, the hydrogen gas pressure introduced into the vacuum chamber is preferably set to the order of about 0.01 Pa.

If the need to increase the introduction pressure to exceed the above-described gas pressure arises, although not shown, an interior wall surrounding the emitter tip 11 may be formed within the vacuum chamber 17. At this time, if the interior wall is configured to include the extraction electrode 13 so that hermeticity is maintained in the area except for the hole of the extraction electrode 13 through which the ion beam 15 passes and the hydrogen gas is introduced into the interior of the interior wall from the gas nozzle 371, this may enable an increase in hydrogen gas pressure only in the vicinity of the emitter electrode 11. Such a configuration enables an increase in gas pressure around the emitter electrode to the order of about 0.1-1 Pa. The above-described upper limit is based on the discharge phenomenon and introducible gas pressure varies in accordance with a potential difference between the emitter electrode and a component with grounding potential or the extraction electrode. Further, the interior wall may be cooled by the above-described cooling mechanism 4. Because the interior wall surrounds the emitter electrode 11, as long as the interior wall is cooled to a similar degree to the emitter electrode 11, the influence of thermal radiation from the vacuum chamber 17 can be made smaller. Further, as long as the interior of the interior wall is maintained under ultrahigh vacuum, the overall vacuum chamber 17 is not necessarily maintained under ultrahigh vacuum.

In order for the apex of the emitter tip 11 to be terminated by three atoms or less, preferably, by a single atom, a method including heating the emitter tip 11 may be used. Further, similarly, in order to sharpen the apex of the emitter tip 11, a method may be used which includes introducing gas, such as, e.g., O2, N2 and/or the like, into the vacuum chamber 17 while heating the emitter tip 11. Further, similarly, in order to sharpen the apex of the emitter tip 11, a method may be used which includes introducing gas, such as, e.g., O2, N2 and/or the like, into the vacuum chamber 17 while applying high voltage between the emitter tip 11 and the extraction electrode 13. Further, similarly, a method may be used in which the emitter tip 11 is formed of a needle with tungsten as the main ingredient, and the emitter tip 11 is heated after precious metal, such as, e.g., iridium, palladium, platinum and/or the like, is evaporated onto the surface of the emitter tip 11.

In this manner, according to the embodiment, it is possible to provide a filed ionization source capable of improving the focusing capability influencing observed resolution and machining width, improving the beam stability, and reducing damage during beam irradiation, in the process of observation and machining of a sample surface by an ion beam.

Second Embodiment

Figure 5:
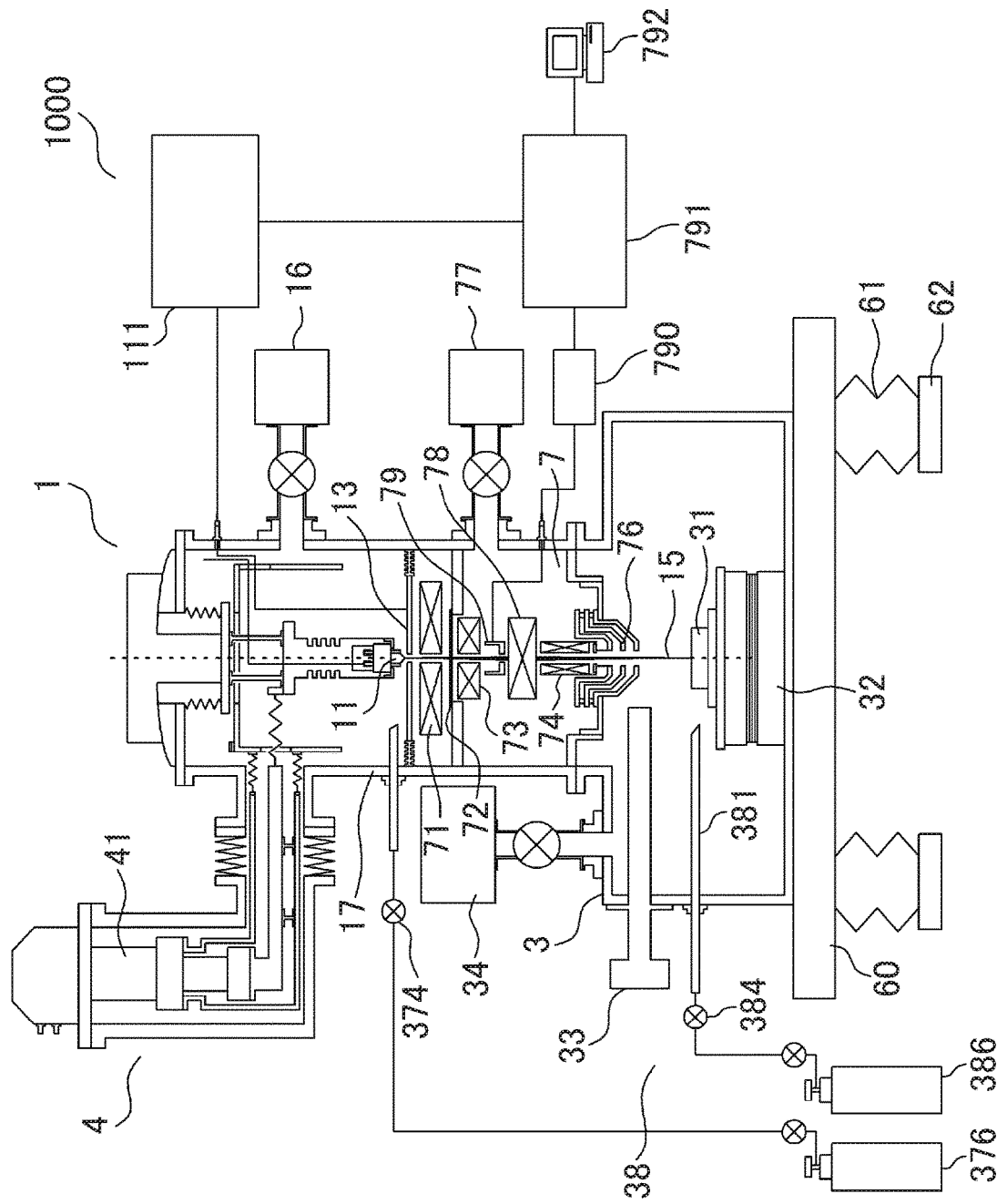
FIG. 5 is a schematic overall configuration cross-sectional view (partial block diagram) of an ion beam apparatus according to a second embodiment of the present invention.

A second embodiment according to the present invention is described with reference to FIG. 5 and FIG. 6. It is noted that the matters/items described in the first embodiment but not described in the embodiment is able to apply to the embodiment unless otherwise circumstances.

An ion beam apparatus 1000 includes the above-described hydrogen gas field ionization source 1, a beam irradiation column 7, a sample chamber 3 and other components, in which the ion beam emitted from the above-described hydrogen gas field ionization source 1 is directed through the beam irradiation column 7 to a sample 31 which is placed on a sample stage 32 within the sample chamber 3. A secondary particle released from the sample 31 is detected by a secondary particle detector 33. It is noted that the ion beam apparatus may include an electron beam irradiation capability component.

The beam irradiation column 7 includes a focusing lens 71, an aperture 72, a first deflector 73, a second deflector 74, an objective lens 76, a mass filter 78 and a Faraday cup 79, by way of example. The optical design for irradiating the sample with the ion beam may be changed depending on which capability is emphasized. Therefore, the beam irradiation column 7 may additionally include other elements such as a lens for focusing the ion beam 15, a deflector for deflection, and/or the like, and the order of the arrangement may be changed, and an element may be omitted.

The ion beam is focused by the focusing lens 71, and the ion beam 15 is limited by the aperture 72 as the probe current 151 is done so that the ion beam is further focused by the objective lens 76 to be a fine shape on the sample surface. The first deflector and the second deflector are used for: axial adjustment to reduce aberration when the lens focuses; ion beam scanning on the sample; and the like.

The Faraday cup 79 may be configured to be connected to an ammeter 790 that measures the amount of ion beam current. Further, a control device 791 may be placed to control the high-voltage power supply 111 by use of the results measured by the ammeter 790. The control device 791 may be configured to be used to adjust the output of the high-voltage power supply 111 in an automatic manner, within the extraction voltage range in which the $H_3^+$ ion emission ratio described in the first embodiment is high. The control device 791 may be configured using, for example, PC, a microcomputer, an electron circuit and/or the like. Further, the control device 791 may be configured to retain the relationship between the measured ion beam current and the extraction voltage on a storage medium. Unless the apex curvature radius of the emitter electrode 11, and/or the like significantly changes, it is expected that there is not a significant change in the extraction voltage range in which the $H_3^+$ ion emission ratio described in the first embodiment is high.

Figure 6A:
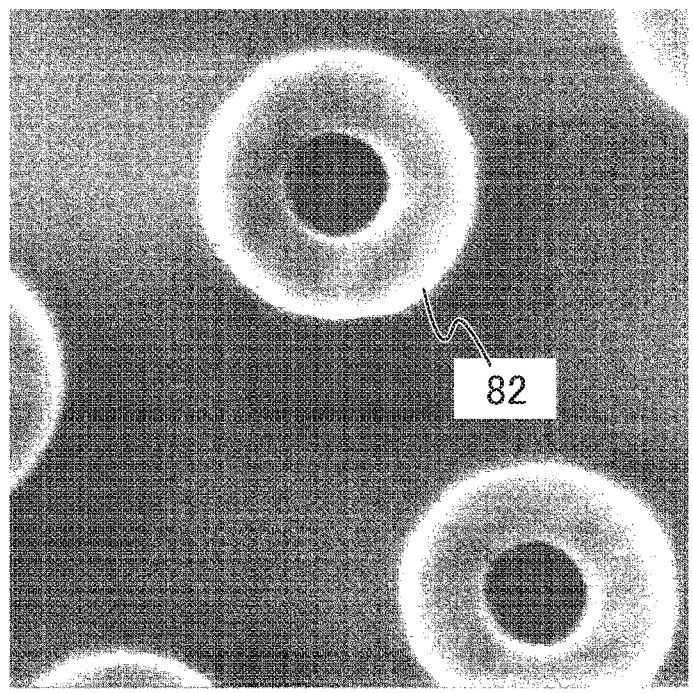
FIG. 6A is an example scanning ion image by a $H_2^+$ ion beam.
Figure 6B:
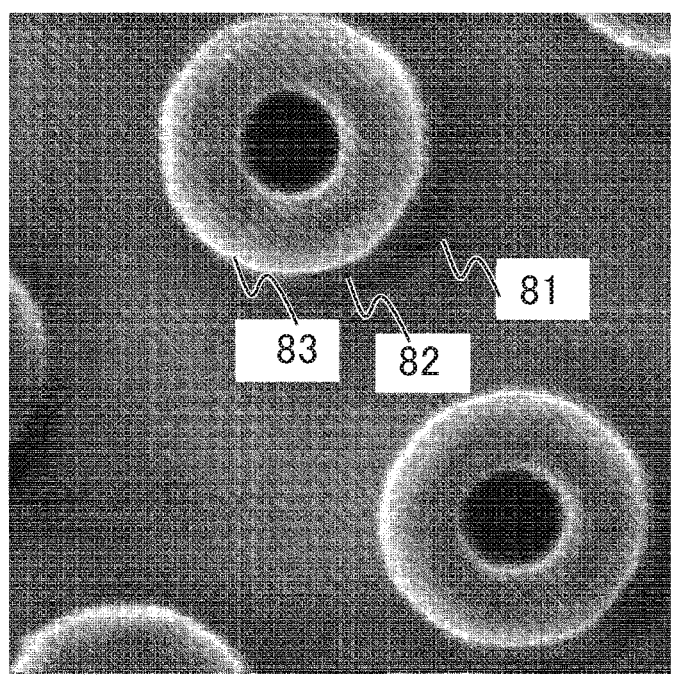
FIG. 6B is an example scanning ion image by a beam containing ion species of $H^+$, $H_2^+$, and $H_3^+$.
Figure 6C:
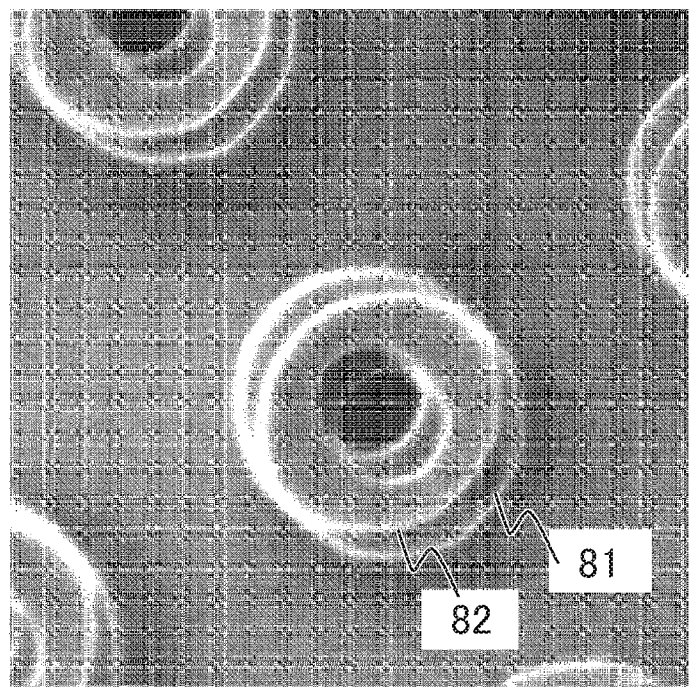
FIG. 6C is an example scanning ion image by a beam containing ion species of $H^+$ and $H_2^+$.
Figure 6D:
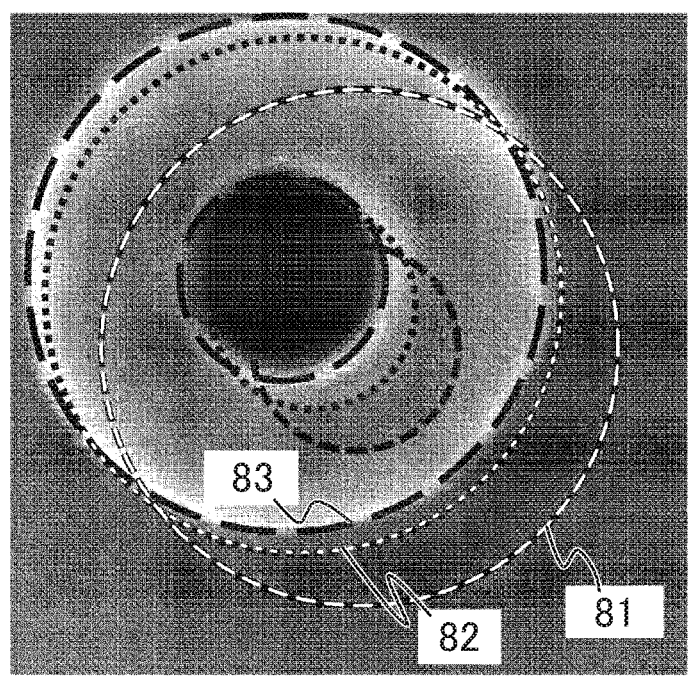
FIG. 6D is a partially enlarged view of FIG. 6B.

FIG. 6A to FIG. 6D illustrate example scanning ion images with ion species being mixed. Specifically, the scanning ion image shown is obtained while the trajectories of the ion beams of $H^+$ ion, $H_2^+$ ion and $H_3^+$ ion are separated by a deflection action caused by magnetic field. FIG. 6A shows the example when the sample is observed by an ion beam containing approximately only $H_2^+$ ion. FIG. 6B shows the example when the sample is observed by an ion beam containing a mixture of $H^+$ ion, $H_2^+$ ion and $H_3^+$ ion. FIG. 6C shows the example when the sample is observed by an ion beam containing a mixture of $H^+$ ion and $H_2^+$ ion. In FIG. 6 only one species of sample edge contrast is observed which is of sample edge contrast by $H_2^+$ ion, whereas in FIG. 6B three species of sample edge contrast are observed which are of sample edge contrast by $H^+$ ion, $H_2^+$ ion, and $H_3^+$ ion, and in FIG. 6C two species of sample edge contrast are observed which are of sample edge contrast by $H^+$ ion and $H_2^+$ ion. In FIG. 6D FIG. 6B is partially enlarge and the edge contrast from each ion is emphasized by dotted lines.

By obtaining the scanning ion images while the trajectories of the respective ions are separated by a deflection magnetic field as described above, the sample surface structure is observed in a multiple manner. In FIG. 6A to FIG. 6D, the phenomenon is prominent in a portion where the contrast is emphasized, for example, in an uneven edge portion of the sample, which is suitable for estimation of an emission ratio between ion species. An extraction voltage for a high emission ratio of the $H_3^+$ ion may be determined from the contrast ratio. At this stage, for estimation of an abundance ratio of each ion species from the contrast ratio of edge portions, a difference between the amounts of secondary electron emission by respective ion species is preferably taken into account.

Figure 6E:
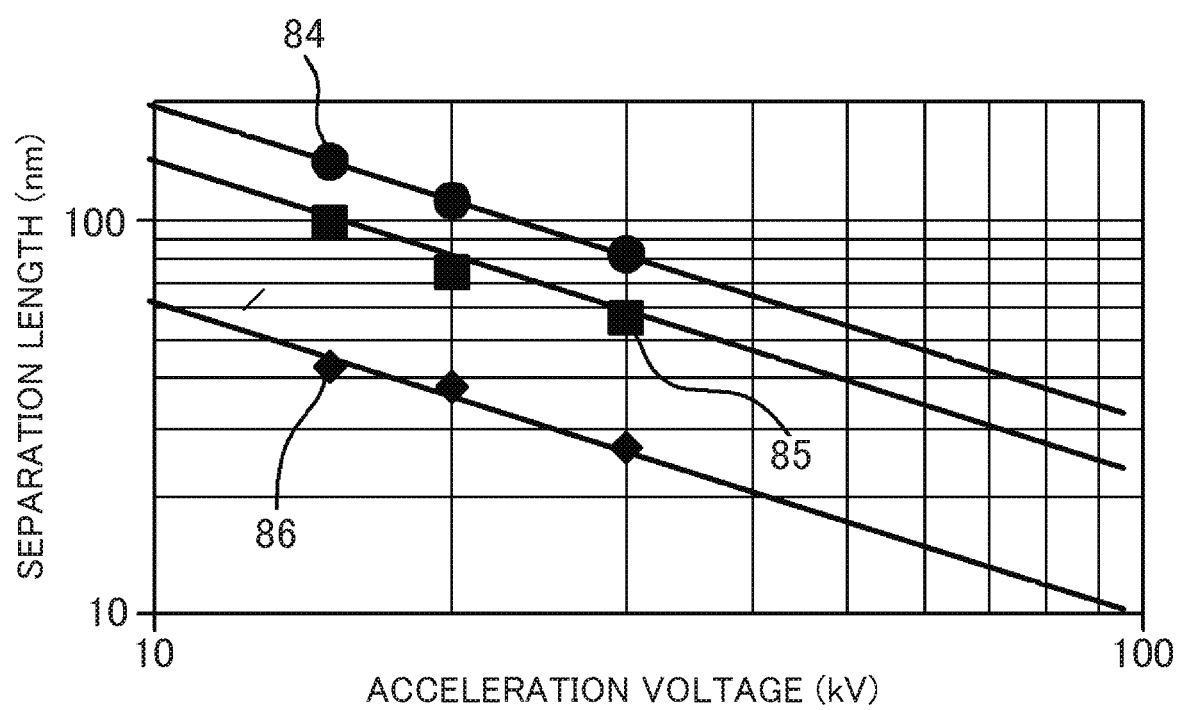
FIG. 6E is a graph showing the relationship between acceleration voltage and separation length of edge contrast, obtained by use of the ion beam apparatus in FIG. 5.

From a separation length of edge contrast, it is estimated which edge contrast is caused by which ion species in the ion beam. In the $H_3^+$ ion with a high mass-to-charge ratio, the deflective influence of a magnetic field is small, and the $H^+$ ion with a low mass-to-charge ratio, the deflective influence of a magnetic field is large. In the example in FIG. 6B, it can be estimated from the mass-to-charge ratio that pair edge contrast 81, 83 with a largest difference of separation length corresponds to the $H^+$ ion and $H_3^+$ ion, and pair edge contrast 82, 83 with a smallest difference of separation length corresponds to the $H_2^+$ ion and $H_3^+$ ion. By changing the strength of the deflection magnetic field or by changing the acceleration of the ion beam, the separation length of the edge contrast between the three species is also changed. FIG. 6E illustrates an example where the ion beam acceleration is changed and the separation length is measured. In this example, the ion beam acceleration is changed to 30 kV, 20 kV, 15 kV. As the acceleration voltage is decreased in a state shown in FIG. 6B, the influence of deflection magnetic field is relatively increased to increase the separation length. Also, even in a constant acceleration voltage, if the deflection magnetic field is changed, the separation length is changed. Here, the largest separation length 84 corresponds to the $H^+$ ion and $H_3^+$ ion, and the smallest separation length 86 corresponds to the $H_2^+$ ion and $H_3^+$ ion. An intermediate separation length 85 corresponds to the $H^+$ ion and $H_2^+$ ion.

If the ion beam 15 is subject to an unintentional magnetic field, and the ion beam contains a plurality of ion species, the separation action as described above may possibly inhibit the sample surface observation. To address this, the materials of the vacuum chamber 17 desirably include materials exhibiting high magnetic permeability, such as, e.g., permalloy, pure iron and/or the like, so as to prevent the ion beam 15 from leakage of the unintentional magnetic field. Further, a component formed from materials exhibiting high magnetic permeability for inhibition of magnetic field leakage may be provided in the vicinity of the optical path along which the ion beam 15 passes, that is, within the vacuum chamber 17. Alternatively, an apparatus cover having a magnetic field leakage inhibition function may be placed on the outside of the vacuum chamber 17. The above three magnetic-field leakage prevention measures may be combined as appropriately needed.

The mass filter 78 may be attached as required. The mass filter 78 is configured to allow specific ion(s) to pass therethrough. The mass filter 78 may be used to measure how much ion(s) other than the $H_3^+$ ion has been emitted from the ion source. For example, the mass filter 78 may be used to measure whether a set value of the extraction voltage is a suitable value for increasing the $H_3^+$ ion emission ratio.

The mass filter 78 may include at least one of elements producing a deflection magnetic field. The $H^+$ ion, the $H_2^+$ ion and the $H_3^+$ ion, which differs in mass-to-charge ratio from each other, are emitted from the same location and are equal in acceleration, are expected to achieve alignment of the trajectories of the ion beams due to a deflection electric field, but expected to achieve separation of the trajectories of the ion beams due to a deflection magnetic field. The trajectory separation may be used to measure the emission ratio between ion species.

If the mass filter 78 is designed to minimize aberration, the mass filter 78 can be used not only to measure the $H_3^+$ ion emission ratio, but also to filter out unwanted ion species, in order to achieve beam irradiation with a high $H_3^+$ ion emission ratio and focusing capability maintained. Further, if the filter is specialized only in separation between the $H_3^+$ ion and the other hydrogen ions ($H^+$ ion and $H_2^+$ ion), the occurrence of the above-described aberration can be minimized. Also, a filter can be created at reduced cost. Typically, the lower the mass-to-charge ratio, the larger amount of deflection of an ion by magnetic field becomes. Also, the higher the mass-to-charge ratio, the easier the ion species are separated.

A dedicated mass filter 78 is not necessarily used for a deflection magnetic field for ion beam separation. For example, a magnetic field may be applied from the first deflector 73, the second deflector 74 and/or the objective lens 76 in the sample chamber 3 into the space between the sample 31 and them. In the case of high ion beam acceleration, e.g., 10 kV or more, an electric field is often used practically for deflection of an ion beam. Because of this, the first deflector 73 and the second deflector 74 may be configured to produce deflection filed based on an electric field in a conventional manner, and a third deflector may be arranged to produce a deflection magnetic field for ion beam separation. Further, the first deflector 73 or the second deflector may be configured to allow the magnetic field to overlap the electric field.

For adjustment of the extraction voltage to be applied to the mass filer 78 and/or the emitter electrode 11 and/or the like, the proportion of the $H_3^+$ ion to the ion beam is preferably set to 80% or more in term of sample observation.

Conventionally, it is conceivable that (1) typically, an extraction voltage causing the current to reach a peak value (first maximum) is used or (2) a lower voltage than a peak value expected to narrow the energy width is used. That is, the width at the second peak is very narrower than that at the first peak, so that detailed experiments were required for discovery. Further, magnetic field application is required to identify ions with different mass-to-charge ratios. However, typically, the use of a deflector producing a magnetic field and/or the like is inconceivable in the ion microscope, and therefore the electric filed deflection and an electric-field lens are typically used for all. Here, by applying a magnetic field for identification, the identification as shown in FIG. 6 has been reached.

Further, similarly to the hydrogen gas $H_2$, diatomic molecules gases $N_2$, $O_2$ are expected to cause a similar phenomenon. Similarly to $H_3^+$, if $N_2$, $O_2$ can be emitted as $N_3^+$ and $O_3^+$, the effect of improving the focusing capability because of a reduction in energy width as compared with $N_2^+$ and $O_2^+$, and the effect of increasing the reactivity to increase the machining speed as compared with $N_2^+$ and $O_2^+$, can be expected.

Figure 7:
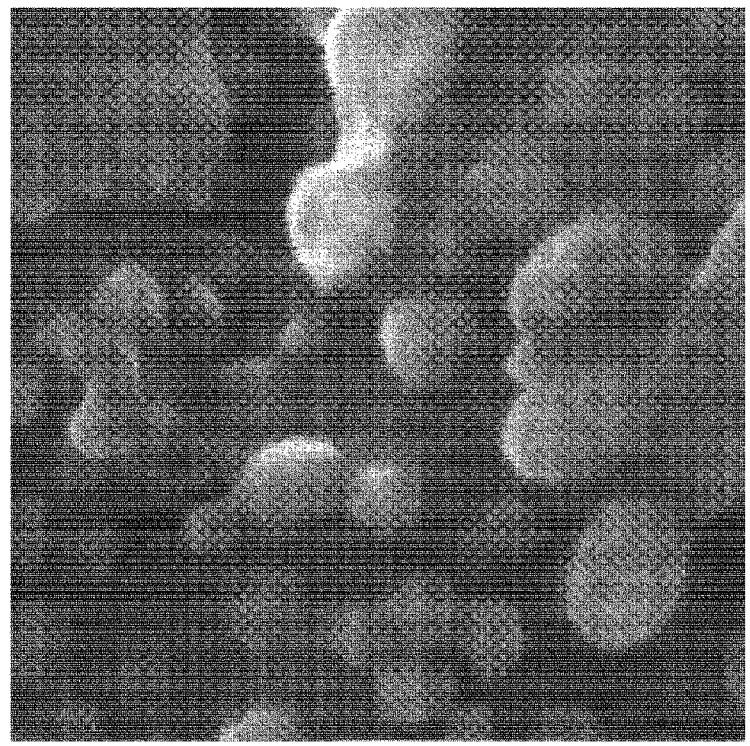
FIG. 7 shows an example SIM image obtained by use of a $H_3^+$ ion beam in the ion beam apparatus in FIG. 5.

FIG. 7 illustrates an example where the sample surface resulting from vapor deposition of gold fine particles onto a carbon matrix material is observed on the condition that the proportion of the $H_3^+$ ion to the ion beam is estimated to be 80% or more. It is seen that satisfactory observation of the sample surface can be made without separation of edge contrast as illustrated in FIG. 6B and FIG. 6C. For the sample observation, the ion beam directed to the sample is recommended to have a diameter of 10 nm or smaller on the sample surface.

The control device 791 may be configured to have a function of estimating an ion species ratio from a scanning ion image of mixed ion species as illustrated in FIG. 6A to FIG. 6D. By automatically obtaining and analyzing a scanning ion image of the ion beam 15 being subject to a deflection magnetic field while the extraction voltage is changed by the control device 791, the dependence of the ratio between mixed ion species in the ion beam on extraction voltage can be determined. The control device 791 may further have a function of controlling the high-voltage power supply 111 based on the determined result. Also, the ion beam apparatus 1000 may include a display function 792. The ion species in process of being emitted in a highest ratio may be displayed on the display function 792. In a further possible configuration, another ion of the same element having a different mass-to-charge ratio may be displayed so that the user can be selected it using the control device 791. For example, the display function 792 may display in what ratio the $H^+$ ion, the $H_2^+$ ion and the $H_3^+$ ion are emitted. The display function 792 may also display which hydrogen ion in process being emitted in a highest ratio.

Also, switching between ions to be directed to the sample may be made by adjusting the extraction voltage applied to the mass filter 78 and/or the emitter electrode 11, and/or the like. Further, in a possible configuration, the user can select which hydrogen ion to be emitted in a highest ratio. The $H^+$ ion, the $H_2^+$ ion and the $H_3^+$ ion differ in penetration depth from each other even in the same acceleration energy. Because of this, by the above-described switching function, the penetration range into the sample is able to be changed for ion implantation, enabling use in the manufacturing process of electron devices, characteristics adjustment, and the like. Besides the adjustment to the extraction voltage, for example, the voltage of a lens, the angle of the tip and/or the like may be used for the control.

The beam irradiation column 7 is evacuated by use of a vacuum pump 77. The sample chamber 3 is evacuated by use of a vacuum pump 34. A differential evacuation structure may be formed as necessary between the hydrogen gas field ionization source 1 and the beam irradiation column 7 and between the beam irradiation column 7 and the sample chamber 3. In short, both the spaces may be configured to maintain airtightness, except for the opening through which the ion beam 15 passes. Such a configuration prevents the gas introduced into the sample chamber 3 from flowing into the hydrogen gas field ionization source to reduce the amount of gas flowing into hydrogen gas field ionization source, thus mitigating the influence. On the other hand, the gas introduced into the hydrogen gas field ionization source 1 is prevented from flowing into the sample chamber 3 to reduce the amount of flowing into the sample chamber 3, thus mitigating the influence.

The ion beam apparatus 1000 may be configured to be installed on an apparatus mount 60 including, for example, a vibration absorption mechanism 61 and a base plate 62 in order to prevent the sample observation and machining performance from being degraded by vibration of the emitter electrode 11 of the hydrogen gas field ionization source 1, the sample 31 loaded in the sample chamber 3, and/or the like. The vibration absorption mechanism 61 may be configured by use of, for example, an air spring, a metallic spring, a gel-like material, rubber and/or the like. Although not shown, an apparatus cover may be placed to cover all or part of the ion beam apparatus 1000. The apparatus cover may be preferably formed of materials capable of blocking or attenuating aerial vibrations from the outside.

A gas introducing mechanism 38 may be provided in the sample chamber 3 for introduction of reactive gas or gas for inhibiting the surface of the sample 31 from being electrically charged into an area around the sample 31. The gas introducing mechanism 38 includes a gas nozzle 381, a flow-rate adjusting unit 384 and a gas cylinder 386. For the reactive gas, for example, XeF2 gas, H2O gas, halogen-based gas or the like may be used as gas for the speeding up of etching on the sample 31, and TEOS gas, hydrocarbon-based gas or gas containing metal such as WF6 gas or the like may be used as gas for the speeding up of deposition. In the sample machining using the gas for the speeding up of etching, the amount of sample machining with respect to the amount of ion implantation can be increased, and therefore a reduction in damage to a substrate of the sample is possible.

In combination with such sample machining using various reactive gases, the ion beam apparatus may be configured to able to apply correction to typical photomasks used in the semiconductor process, correction to photomasks used in the semiconductor process using EUV, correction to mold used in nanoimprint lithography, and/or the like, by way example. The $H_3^+$ ion beam with a small energy width for good focusing ability is ideal for correction to the photomasks and the mold which have a similar size to the structure of a semiconductor device. Further, the ion beam apparatus 1000 may be configured to create a device by use of the sample machining using reactive gas and the reactivity of the $H_3^+$ ion beam itself without gas introduction.

The sample chamber 3 is evacuated by the vacuum pump 34. For the vacuum pump 34, for example, a turbo-molecular pump, an ion sputter pump, a non-evaporative getter pump, a sublimation pump, a cryopump and the like may be used. These pumps may not necessarily be used singly, and may be used in combination of two or more. Further, the apparatus may be configured to operate the vacuum pump 34 in association with the above-described gas introducing mechanism only when gas is introduced through the gas nozzle 381, or alternatively, a valve may be placed between the vacuum pump 34 and the sample chamber 3 to adjust the amount of evacuation.

Although not shown, a sample replacement chamber may be provided in the sample chamber 3. If the sample replacement chamber is configured to able to perform preliminary evacuation to replace the sample 31, this makes it possible to reduce the degree of loss of vacuum in the sample chamber 3 at sample replacement.

In this manner, according to the embodiment, it is possible to provide an ion beam apparatus and a beam irradiation method (observing method and machining method) with which high observed resolution, smaller machining width, excellent beam stability, and a lower level of damage during beam irradiation can be provided in the process of observation and machining of a sample surface by an ion beam.

LIST OF REFERENCE SIGNS

1 . . . Hydrogen gas field ionization source
5 . . . Apex
6 . . . Apex
11 . . . Emitter electrode (emitter tip)
13 . . . Extraction electrode
15 . . . Ion beam
16 . . . Vacuum evacuation unit
17 . . . Vacuum chamber
21 . . . Voltage range
22 . . . First maximum
23 . . . Second maximum
24 . . . Probe current value
25 . . . Maximum
26 . . . Voltage range
100 . . . Apex shape of emitter electrode 11
101 . . . Apex shape of emitter electrode 11
111 . . . High-voltage power supply
151 . . . Prove current
152 . . . Beam limit divergence angle
153 . . . Optical axis
161 . . . Flow-rate adjusting unit
200 . . . Graph
201 . . . Graph
203 . . . Graph
204 . . . Graph
301 . . . FIN image
302 . . . FIN image
303 . . . FIN image
304 . . . FIN image
3 . . . Sample chamber
31 . . . Sample
32 . . . Sample stage
33 . . . Secondary particle detector
34 . . . Vacuum pump
37 . . . Gas introducing mechanism (gas feed unit)
371 . . . Gas nozzle
374 . . . Gas flow-rate adjusting unit
376 . . . Gas cylinder
38 . . . Gas introducing mechanism
381 . . . Gas nozzle
384 . . . Flow-rate adjusting mechanism
386 . . . Gas cylinder
4 . . . Cooling mechanism
41 . . . Refrigerator body
412 . . . First refrigerator stage
413 . . . Second refrigerator stage
415 . . . Thermal radiation shield
416 . . . Heat exchanging unit
51 . . . Atom
52 . . . Atom
60 . . . Apparatus mount
61 . . . Vibration absorption mechanism
62 . . . Base plate
7 . . . Beam irradiation column
71 . . . Focusing lens
72 . . . Aperture
73 . . . First deflector
74 . . . Second deflector
76 . . . Objective lens
77 . . . Vacuum pump
78 . . . Mass filter
79 . . . Faraday cup
790 . . . Ammeter
791 . . . Control device
792 . . . Display function
81 . . . Sample edge contrast by $H^+$ ion
82 . . . Sample edge contrast by $H_2^+$ ion
83 . . . Sample edge contrast by $H_3^+$ ion
84 . . . Separation length
85 . . . Separation length
86 . . . Separation length
1000 . . . Ion beam apparatus

The invention claimed is:

1. An ion beam apparatus, comprising:
a gas field ionization source that emits an ion beam containing a $H^+$ ion, a $H_2^+$ ion and a $H_3^+$ ion;
a beam irradiation column that includes a lens capable of focusing an ion emitted from the gas field ionization source, and a deflector capable of deflecting the ion beam;
a sample stage on which a sample to be irradiated with the ion beam as the ion beam passes through the beam irradiation column; and
a sample chamber that houses at least the sample stage, wherein an extraction voltage is applied between an emitter electrode and an extraction electrode, and
wherein the extraction voltage is set around a second voltage higher than a first voltage, the first voltage giving a first maximum of an ion current per the extraction voltage, and the second voltage giving a second maximum of an ion current per the extraction voltage, such that an abundance ratio of the $H_3^+$ ion is the highest in ion species emitted from an emitter tip of the gas field ionization source, and an energy width of the $H_3^+$ ion is smaller than an energy width of the $H_2^+$ ion.

2. The ion beam apparatus according to claim 1, further comprising a filter that allows an emitted $H_3^+$ ion to penetrate based on ion mass in a selective manner.

3. The ion beam apparatus according to claim 2, wherein the filter has a function of allowing only the emitted $H_3^+$ ion to penetrate in the selective manner.

4. The ion beam apparatus according to claim 2, wherein the filter has a function of producing a magnetic field.

5. The ion beam apparatus according to claim 1, further comprising a function of correcting a mask or mold for nanoimprint lithography by the ion beam.

6. An ion beam apparatus, comprising:
a gas field ionization source;
a beam irradiation column that is equipped with a lens capable of focusing an ion emitted from the gas field ionization source, and a deflector capable of deflecting an ion beam;
a sample stage on which a sample is loaded, wherein the sample is to be irradiated with the ion beam as the ion beam passes through the beam irradiation column; and
a sample chamber that houses at least the sample stage, wherein the ion beam apparatus has an operation status to cause ion emission at an extraction voltage to be applied between an emitter electrode and an extraction electrode,
wherein the extraction voltage is set around a second extraction voltage higher than a first extraction voltage, the first extraction voltage giving a first maximum of an ion current per the extraction voltage, and the second extraction voltage giving a second maximum of an ion current per the extraction voltage, such that an abundance ratio of a first ion species is the highest in ion species emitted from an emitter tip of the gas field ionization source, and an energy width of the first ion species is smaller than an energy width of a second ion species, and wherein the ion species include the first ion species, the second ion species and a third ion species.

7. The ion beam apparatus according to claim 6, further comprising a filter that allows an emitted ion to penetrate based on ion mass in a selective manner.

8. The ion beam apparatus according to claim 7, wherein the filter has a function of allowing only the emitted ion to penetrate in the selective manner.

9. A gas field ionization source, comprising:

an emitter tip that has a needle-shaped apex;

an extraction electrode that has an opening facing the emitter tip and located at a distance from the emitter tip;

gas feed piping for feeding gas into an area around the emitter tip;

a unit that applies and adjusts a voltage between the emitter tip and the extraction electrode to produce an electric field for ionization of the gas; and a unit that cools the emitter tip, wherein the gas is a gas containing hydrogen, and the gas field ionization source has an operating status in which an extraction voltage is applied between an emitter electrode and an extraction electrode; and wherein the extraction voltage is set around a second voltage higher than a first voltage, the first voltage giving a first maximum of an ion current per the extraction voltage, and the second voltage giving a second maximum of an ion current per the extraction voltage, such that an abundance ratio of a $H_3^+$ ion in a probe current is the highest in ion species emitted from the emitter tip, and an energy width of the $H_3^+$ ion is smaller than an energy width of a $H_2^+$ ion, and wherein the ion species include a $H^+$ ion, the $H_2^+$ ion and the $H_3^+$ ion.

10. A gas field ionization source, comprising:

an emitter tip that has a needle-shaped apex;

an extraction electrode that has an opening facing the emitter tip and located at a distance from the emitter tip;

gas feed piping for feeding gas into an area around the emitter tip;

a unit that applies a voltage between the emitter tip and the extraction electrode to produce an electric field for ionization of the gas; and a unit that cools the emitter tip, wherein the gas is a gas containing hydrogen, wherein the gas field ionization source has an operation status to cause ion emission at an extraction voltage applied between an emitter electrode and an extraction electrode, wherein the extraction voltage is set around a second extraction voltage higher than a first extraction voltage, the first extraction voltage giving a first maximum of an ion current per the extraction voltage, and the second extraction voltage giving a second maximum of an ion current per the extraction voltage, such that an abundance ratio of a first ion species is the highest in ion species emitted from the emitter tip, and an energy width of the first ion species is smaller than an energy width of a second ion species, and wherein the ion species include the first ion species, the second ion species and a third ion species.

11. The gas field ionization source according to claim 10, wherein an abundance ratio of a $H_3^+$ ion is 80% or more.

12. The gas field ionization source according to claim 10, wherein the apex is terminated by a single atom.

13. A beam irradiation method, comprising:

causing an emitter tip of a field ionization source to emit an ion beam;

irradiating a sample with the ion beam in which an extraction voltage is applied between an emitter electrode and an extraction electrode and is set around a second voltage higher than a first voltage, the first voltage giving a first maximum of an ion current per the extraction voltage, and the second voltage giving a second maximum of an ion current per the extraction voltage, such that an abundance ratio of a $H_3^+$ ion is the highest in ion species emitted from the emitter tip, and an energy width of the $H_3^+$ ion is smaller than an energy width of a $H_2^+$ ion, and wherein the ion species include a $H^+$ ion, the $H_2^+$ ion and the $H_3^+$ ion; and machining any of a shape, composition and potential of the sample by use of a reaction occurring by irradiating the sample with the ion beam.

14. A beam irradiation method comprising:

causing ion emission at an extraction voltage that is set around a second extraction voltage higher than a first extraction voltage, the first extraction voltage giving a first maximum of an ion current per the extraction voltage, and the second extraction voltage giving a second maximum of an ion current per the extraction voltage, such that an abundance ratio of a first ion species is the highest in ion species emitted from an emitter tip of a gas field ionization source, and an energy width of the first ion species is smaller than an energy width of a second ion species, wherein the ion species include the first ion species, the second ion species and a third ion species, and wherein at least one of the abundance ratio of the first ion species, an abundance ratio of the second ion species and an abundance ratio of the third ion species is changeable; and machining any of a shape, composition and potential of a sample by use of a reaction occurring by irradiating the sample with an ion beam formed from the ion emission.

15. The beam irradiation method according to claim 14, wherein a ratio of a $H_3^+$ ion in emitted ions is highest among said emitted ions.

16. The ion beam apparatus according to claim 1, wherein an extraction voltage ranges between (1) an absolute value of the extraction voltage corresponding to a second maximum of an ion current of said ion beam containing the $H_3^+$ ion, and (2) a value equal to 5% below said absolute value.

17. The ion beam apparatus according to claim 6, wherein said second extraction voltage ranges between (1) an absolute value of the second extraction voltage corresponding to said second maximum of the ion current and (2) a value equal to 5% below said absolute value.

18. The gas field ionization source according to claim 9, wherein an extraction voltage ranges between (1) an absolute value of the extraction voltage corresponding to a second maximum of an ion current of said ion beam containing the $H_3^+$ ion, and (2) a value equal to 5% below said absolute value.

19. The gas field ionization source according to claim 10, wherein said second extraction voltage ranges between (1) an absolute value of the second extraction voltage corresponding to said second maximum of the ion current and (2) a value equal to 5% below said absolute value.

20. The beam irradiation method according to claim 13, wherein said step of irradiating the sample further comprises setting an extraction voltage to a value ranging between (1) an absolute value of the extraction voltage corresponding to a second maximum of an ion current of said ion beam containing the $H_3^+$ ion, and (2) a value equal to 5% below said absolute value.

21. The beam irradiation method according to claim 14, wherein said second extraction voltage ranges between (1) an absolute value of the second extraction voltage corresponding to said second maximum of the ion current and (2) a value equal to 5% below said absolute value.

22. The ion beam apparatus according to claim 1, wherein, in the first voltage, an abundance ration of the $H_2^+$ ion is the highest in ion species emitted from the emitter tip of the gas field ionization source.

\* \* \* \* \*